(12) United States Patent
Rabjohn et al.

(10) Patent No.: US 12,519,457 B2
(45) Date of Patent: Jan. 6, 2026

(54) TEMPERATURE BASED GAIN DROOP COMPENSATION CIRCUIT

(71) Applicant: SKYWORKS SOLUTIONS, INC., Irvine, CA (US)

(72) Inventors: Gordon Glen Rabjohn, Ottawa (CA); Anatoli Pukhovski, Ottawa (CA); Pietro Natale Alessandro Chyurlia, Ottawa (CA)

(73) Assignee: SKYWORKS SOLUTIONS, INC., Irvine, CA (US)

( * ) Notice: Subject to any disclaimer, the term of this patent is extended or adjusted under 35 U.S.C. 154(b) by 341 days.

(21) Appl. No.: 18/180,301

(22) Filed: Mar. 8, 2023

(65) Prior Publication Data

US 2023/0299749 A1    Sep. 21, 2023

Related U.S. Application Data

(60) Provisional application No. 63/319,828, filed on Mar. 15, 2022, provisional application No. 63/319,825, filed on Mar. 15, 2022, provisional application No. 63/319,829, filed on Mar. 15, 2022.

(51) Int. Cl.
| | |
|---|---|
| *H03H 7/25* | (2006.01) |
| *G01K 3/08* | (2006.01) |
| *G01K 7/01* | (2006.01) |
| *H03H 11/24* | (2006.01) |

(52) U.S. Cl.
CPC ............. *H03H 11/24* (2013.01); *G01K 3/08* (2013.01); *G01K 7/01* (2013.01); *H03H 7/256* (2013.01)

(58) Field of Classification Search
CPC ............ G01K 3/08; G01K 7/01; H03H 7/256; H03H 11/24
USPC ........................................................ 327/308
See application file for complete search history.

(56) References Cited

U.S. PATENT DOCUMENTS

| | | | |
|---|---|---|---|
| 3,346,805 A | 10/1967 | Hekimian | |
| 4,195,274 A | 3/1980 | Suganuma | |
| 5,809,420 A * | 9/1998 | Ichiyanagi | H03G 3/3047 455/430 |
| 6,097,240 A * | 8/2000 | Lapushin | H01C 7/008 327/513 |
| 6,297,709 B1 * | 10/2001 | Wey | H03H 11/24 455/249.1 |
| 6,335,821 B1 * | 1/2002 | Suzuki | H01S 3/06754 359/337.11 |
| 9,985,588 B2 | 5/2018 | Rogers | |
| 10,320,336 B2 | 6/2019 | Rogers | |

(Continued)

*Primary Examiner* — William Hernandez
(74) *Attorney, Agent, or Firm* — Lando & Anastasi, LLP

(57) ABSTRACT

A temperature controlled attenuator circuit is disclosed. The temperature controlled attenuator circuit comprises a temperature sensor circuit for sensing the temperature of an electronic component and generating a control voltage inversely proportional to a difference in temperature between an ambient temperature and the temperature of the electronic component and a variable attenuator circuit configured to vary its attenuation based upon the control voltage to provide an attenuation based upon the difference in temperature between the ambient temperature and the temperature of the electronic component. A radio frequency module and wireless device comprising said temperature controlled attenuator circuit are also provided.

24 Claims, 13 Drawing Sheets

(56) References Cited

U.S. PATENT DOCUMENTS

| | | |
|---|---|---|
| 2004/0100339 A1 | 5/2004 | Feilkas et al. |
| 2009/0179706 A1 | 7/2009 | Wong |
| 2011/0187461 A1* | 8/2011 | Mochizuki ............... H03F 3/04 330/310 |
| 2013/0127544 A1 | 5/2013 | Murakami |
| 2013/0187712 A1 | 7/2013 | Cabanillas et al. |
| 2014/0145785 A1 | 5/2014 | Bandyopadhyay et al. |
| 2016/0099711 A1 | 4/2016 | Uemura et al. |
| 2019/0279977 A1 | 9/2019 | Ma et al. |
| 2020/0136369 A1 | 4/2020 | Chauhan et al. |
| 2021/0083659 A1 | 3/2021 | Mayer et al. |
| 2021/0126598 A1 | 4/2021 | Rogers |
| 2022/0329211 A1 | 10/2022 | Krishnan et al. |
| 2023/0117991 A1 | 4/2023 | Chyurlia et al. |
| 2023/0296446 A1 | 9/2023 | Rabjohn et al. |
| 2023/0299748 A1 | 9/2023 | Rabjohn et al. |
| 2025/0044162 A1 | 2/2025 | Hope |

* cited by examiner

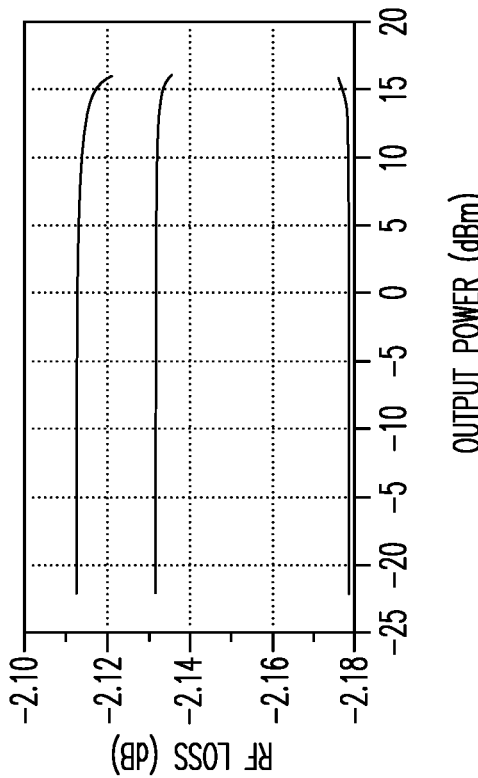
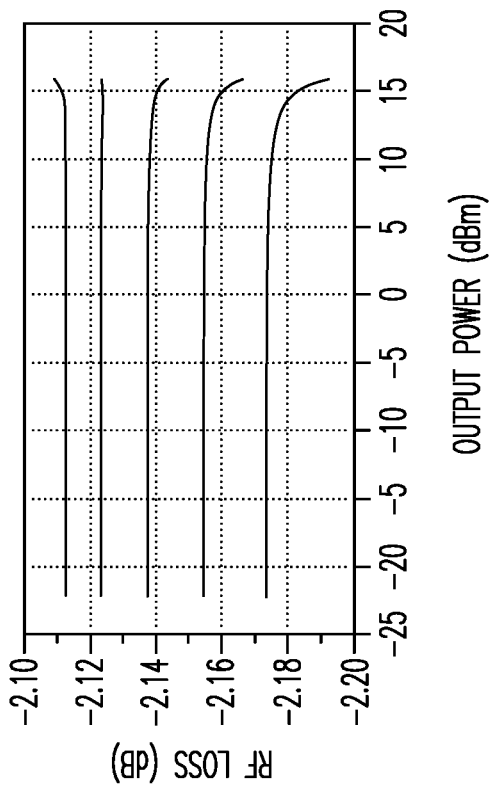
FIG. 12A
FIG. 12B

TEMPERATURE BASED GAIN DROOP COMPENSATION CIRCUIT

CROSS-REFERENCE TO RELATED APPLICATIONS

This application claims priority under 35 U.S.C. § 119(e) to U.S. Provisional Patent Application Ser. No. 63/319,829, titled "TEMPERATURE BASED GAIN DROOP COMPENSATION CIRCUIT," filed Mar. 15, 2022, to U.S. Provisional Patent Application Ser. No. 63/319,825, titled "VARIABLE ATTENUATION CIRCUIT UTILIZING VARACTOR DIODES," filed Mar. 15, 2022, and to U.S. Provisional Patent Application Ser. No. 63/319,828, titled "TEMPERATURE SENSING CIRCUIT WITH SHUT OFF," filed Mar. 15, 2022, the contents of each being incorporated herein by reference in their entireties for all purposes.

BACKGROUND

Field

Aspects and embodiments disclosed herein relate to attenuator circuits and temperature sensor circuits, in particular temperature controlled attenuator circuits. Aspects and embodiments disclosed herein also relate to temperature controlled attenuator circuits for amplifier gain droop compensation. Aspects and embodiments disclosed herein relate to radio frequency modules and wireless devices comprising the same.

Description of the Related Technology

When an amplifier is turned on, the active amplification devices within the amplifier turn on and hence some level of self-heating of the amplifier is realized such that a temperature at and/or around the amplifier may increase. In some examples, an amplifier may have multiple amplification stages which may each experience some level of self-heating. This 'self-heating' effect may result in a decrease of gain of the amplifier and/or gain variation over time which may cause degradation of the error vector magnitude (EVM) of the amplifier (which is a measure of linearity).

Existing techniques to compensate for such gain droop/variation include employing a silicon controller using a programmable RC time delay in combination with a temperature dependent current source. Such a system requires the added die of the controller which significantly increases cost as well as requiring test time to program the controller.

Other techniques include using simple fixed RC delays on the bias of a power amplifier, but this only allows for correction at either the beginning or the end of a burst, rather than flattening out the entire burst. There are multiple time constants that cannot be fixed with a single RC. Also, the time constant may depend on various poorly controlled process characteristics, like die attach quality, heat sinking, and supply voltage, making a single fixed RC inappropriate over a range of process variables.

SUMMARY

According to one embodiment there is provided a variable attenuator circuit. The variable attenuator circuit comprises a plurality of varactor diodes configured to attenuate an RF signal between an RF input and an RF output, a reference voltage input, and a control voltage input configured to vary the attenuation of the variable attenuator circuit based upon a control voltage.

In one example, the control voltage is configured to vary the attenuation of the variable attenuator circuit by changing the capacitances of one or more of the plurality of varactor diodes.

In one example, the plurality of varactor diodes is arranged in a T-type or an L-type attenuator configuration.

In one example, the plurality of varactor diodes is arranged in a pi-type attenuator configuration.

In one example, the pi-type attenuator configuration comprises a first varactor diode connected in a series position between the RF input and the RF output and a second and a third varactor diodes, the second and third varactor diodes each connected in a shunt position on either side of the first varactor diode.

In one example, the variable attenuator circuit further comprises a first resistor arranged in parallel with the first varactor diode, a second resistor in a shunt position and in series with the second varactor diode, and a third resistor in a shunt position and in series with the third varactor diode.

In one example, the second and third varactor diodes are connected to ground and are arranged in series between the ground connection and the second and third resistors, respectively.

In one example, the variable attenuator further comprises a first DC blocking capacitor arranged in series with the first varactor diode. Optionally it is arranged such that the first resistor is arranged in parallel with both the first DC blocking capacitor and the first varactor diode.

In one example, the variable attenuator further comprises a second DC blocking capacitor arranged between the RF input and the shunt position of the second varactor diode.

In one example, the variable attenuator further comprises a first inductor arranged in a shunt position between the second DC blocking capacitor and the RF input.

In one example, the variable attenuator further comprises a third DC blocking capacitor arranged between the RF output and the shunt position of the third varactor diode.

In one example, the variable attenuator further comprises a second inductor arranged in a shunt position between the third DC blocking capacitor and the RF output.

In one example, at least one of the first, second, and third varactor diodes is formed as a bipolar junction transistor having emitter and collector terminals connected together.

In one example, the at least one of the first, second, and third varactor diodes formed as a bipolar junction transistor is an NPN bipolar junction transistor.

In one example, the variable attenuator further comprises a fourth varactor diode arranged in series with the first varactor diode and in an opposite direction in a back-to-back arrangement.

In one example, the variable attenuator further comprises a fifth varactor diode arranged in series with the second varactor diode and in an opposite direction in a back-to-back arrangement and/or a sixth varactor diode arranged in series with the third varactor diode and in an opposite direction in a back-to-back arrangement.

In one example, the variable attenuator is implemented on a gallium arsenide substrate According to another embodiment there is provided a radio frequency module comprising a variable attenuator, the variable attenuator having a plurality of varactor diodes configured to attenuate an RF signal between an RF input and an RF output; a reference voltage input, and a control voltage input configured to vary the attenuation of the variable attenuator circuit based upon a control voltage.

According to another embodiment there is provided a wireless device comprising a variable attenuator, the variable attenuator circuit having a plurality of varactor diodes configured to attenuate an RF signal between an RF input and an RF output; a reference voltage input, and a control voltage input configured to vary the attenuation of the variable attenuator circuit based upon a control voltage.

According to another embodiment there is provided a temperature sensor circuit for sensing the temperature of an electronic component. The temperature sensor circuit comprises a first transistor configured to be thermally isolated from the electronic component and being configured to sense an ambient temperature, and a second transistor configured to be thermally linked to the electronic component and being configured to sense a temperature at the electronic component, the temperature sensor circuit being a differential circuit having a first path and a second path with the first and second transistors being arranged on the first and second paths of the differential circuit, respectively, such that the temperature sensor circuit generates an output voltage inversely proportional to a temperature difference between the ambient temperature and the temperature at the electronic component, and a shut-off switch configured to activate or deactivate the temperature sensor circuit.

In one example, the temperature sensor circuit further comprises a first resistor and a second resistor arranged on the first and second paths of the differential circuit, respectively.

In one example, the first transistor comprises a base, a collector, and an emitter, the collector of the first transistor being coupled to the base of the first transistor.

In one example, the second transistor comprises a base, a collector, and an emitter, the collector of the first transistor being coupled to the base of the second transistor.

In one example, the temperature sensor circuit further comprises a third transistor coupled to the temperature sensor circuit, a base of the third transistor being coupled to the collector of the second transistor.

In one example, the third transistor is configured such that the current it draws decreases in response to heating at the second transistor.

In one example, the temperature sensor circuit further comprises either or both of a third resistor and a fourth resistor, the third resistor being arranged to couple the first and second paths of the differential circuit in parallel and the fourth resistor being arranged to couple the second path of the differential circuit to the collector of the third resistor such that the variation with temperature of the control signal can be set based upon the resistances of the third and/or fourth resistors.

In one example, the temperature sensor circuit is configured such that the output voltage of the temperature sensor circuit is taken at the collector of the third transistor.

In one example, the shut-off switch is configured such that the temperature sensor circuit can be activated or deactivated based on a shut-off control signal.

In one example, the shut-off switch comprises a fourth transistor, the fourth transistor having a collector connected to the emitters of each of the first transistor, the second transistor, and the third transistor.

In one example, the temperature sensor circuit further comprises one or more emitter resistors coupled between the emitter of at least one of the first transistor, the second transistor, and the third transistor and the collector of the fourth transistor.

In one example, the temperature sensor circuit further comprises a voltage source configured to provide a regulated input voltage to the temperature sensor circuit.

In one example, the first and second transistors are NPN transistors.

In one example, the temperature sensor circuit is implemented on a gallium arsenide substrate.

According to another embodiment there is provided a radio frequency module comprising a temperature sensor circuit for sensing the temperature of an electronic component, the temperature sensor circuit having a first transistor configured to be thermally isolated from the electronic component and being configured to sense an ambient temperature, a second transistor configured to be thermally linked to the electronic component and being configured to sense a temperature at the electronic component, the temperature sensor circuit being a differential circuit having a first path and a second path with the first and second transistors being arranged on the first and second paths of the differential circuit, respectively, such that the temperature sensor circuit generates an output voltage inversely proportional to a temperature difference between the ambient temperature and the temperature at the electronic component, and a shut-off switch configured to activate or deactivate the temperature sensor circuit.

According to another embodiment there is provided a wireless device comprising a temperature sensor circuit for sensing the temperature of an electronic component, the temperature sensor circuit having a first transistor configured to be thermally isolated from the electronic component and being configured to sense an ambient temperature, a second transistor configured to be thermally linked to the electronic component and being configured to sense a temperature at the electronic component, the temperature sensor circuit being a differential circuit having a first path and a second path with the first and second transistors being arranged on the first and second paths of the differential circuit respectively such that the temperature sensor circuit generates an output voltage inversely proportional to a temperature difference between the ambient temperature and the temperature at the electronic component, and a shut-off switch configured to activate or deactivate the temperature sensor circuit.

According to another embodiment there is provided a temperature controlled attenuator circuit comprising a temperature sensor circuit for sensing the temperature of an electronic component and generating a control voltage inversely proportional to a difference in temperature between an ambient temperature and the temperature of the electronic component, and a variable attenuator circuit configured to vary its attenuation based upon the control voltage to provide an attenuation based upon the difference in temperature between the ambient temperature and the temperature of the electronic component.

In one example, the variable attenuator circuit has a plurality of varactor diodes configured to attenuate an RF signal between an RF input and an RF output, a reference voltage input, and a control voltage input configured to vary the attenuation of the variable attenuator circuit based upon the control voltage.

In one example, the control voltage is configured to vary the attenuation of the variable attenuator circuit by changing the capacitances of one or more of the plurality of varactor diodes.

In one example, the plurality of varactor diodes is arranged in a T-type or an L-type attenuator configuration.

In one example, the plurality of varactor diodes is arranged in a pi-type attenuator configuration.

In one example, the pi-type attenuator configuration comprises a first varactor diode connected in a series position between the RF input and the RF output and a second and a third varactor diode, the second and third varactor diodes each connected in a shunt position on either side of the first varactor diode.

In one example, the variable attenuator circuit further comprises a first resistor arranged in parallel with the first varactor diode, a second resistor in a shunt position and in series with the second varactor diode, and a third resistor in a shunt position and in series with the third varactor diode.

In one example, the second and third varactor diodes are connected to ground and are arranged in series between the ground connection and the second and third resistors, respectively.

In one example, the variable attenuator further comprises a first DC blocking capacitor arranged in series with the first varactor diode, optionally such that the first resistor is arranged in parallel with both the first DC blocking capacitor and the first varactor diode.

In one example, the variable attenuator further comprises a second DC blocking capacitor arranged between the RF input and the shunt position of the second varactor diode.

In one example, the variable attenuator further comprises a first inductor arranged in a shunt position between the second DC blocking capacitor and the RF input.

In one example, the variable attenuator further comprises a third DC blocking capacitor arranged between the RF output and the shunt position of the third varactor diode.

In one example, the variable attenuator further comprises a second inductor arranged in a shunt position between the third DC blocking capacitor and the RF output.

In one example, at least one of the first, second, and third varactor diodes is formed as a bipolar junction transistor having emitter and collector terminals connected together.

In one example, the at least one of the first, second, and third varactor diodes formed as a bipolar junction transistor is an NPN bipolar junction transistor.

In one example, the variable attenuator further comprises a fourth varactor diode arranged in series with the first varactor diode and in an opposite direction in a back-to-back arrangement.

In one example, the variable attenuator further comprises a fifth varactor diode arranged in series with the second varactor diode and in an opposite direction in a back-to-back arrangement and/or a sixth varactor diode arranged in series with the third varactor diode and in an opposite direction in a back-to-back arrangement.

In one example, the temperature sensor circuit has a first transistor configured to be thermally isolated from the electronic component and being configured to sense the ambient temperature, and a second transistor configured to be thermally linked to the electronic component and being configured to sense the temperature at the electronic component, the temperature sensor circuit being a differential circuit having a first path and a second path with the first and second transistors being arranged on the first and second paths of the differential circuit, respectively, such that the temperature sensor circuit generates the control voltage inversely proportional to a temperature difference between the ambient temperature and the temperature at the electronic component.

In one example, the temperature sensor further has a shut-off switch configured to activate or deactivate the temperature sensor circuit.

In one example, the temperature controlled attenuator circuit further comprises a first resistor and a second resistor arranged on the first and second paths of the differential circuit, respectively.

In one example, the first transistor comprises a base, a collector, and an emitter, the collector of the first transistor being coupled to the base of the first transistor.

In one example, the second transistor comprises a base, a collector, and an emitter, the collector of the first transistor being coupled to the base of the second transistor.

In one example, the temperature controlled attenuator circuit further comprises a third transistor coupled to the temperature sensor circuit, a base of the third transistor being coupled to the collector of the second transistor.

In one example, the third transistor is configured such that the current it draws decreases in response to heating at the second transistor.

In one example, the temperature controlled attenuator circuit further comprises either or both of a third resistor and a fourth resistor, the third resistor being arranged to couple the first and second paths of the differential circuit in parallel and the fourth resistor being arranged to couple the second path of the differential circuit to the collector of the third resistor such that the variation with temperature of the control signal can be set based upon the resistances of the third and/or fourth resistors.

In one example, temperature controlled attenuator circuit is configured such that the output voltage of the temperature sensor circuit is taken at the collector of the third transistor.

In one example, the shut-off switch is configured such that the temperature sensor circuit can be activated or deactivated based on a shut-off control signal.

In one example, the temperature sensor further has a shut-off switch configured to activate or deactivate the temperature sensor circuit, wherein the shut-off switch comprises a fourth transistor, the fourth transistor having a collector of the fourth transistor connected to the emitters of each of the first transistor, the second transistor, and the third transistor.

In one example, the temperature controlled attenuator circuit further comprises one or more emitter resistors coupled between the emitter of at least one of the first transistor, the second transistor, and the third transistor and the collector of the fourth transistor.

In one example, the temperature controlled attenuator circuit further comprises a voltage source configured to provide a regulated input voltage to the temperature sensor circuit.

In one example, the first and second transistors are NPN transistors.

In one example, the temperature controlled attenuator circuit is implemented on a gallium arsenide substrate.

According to another embodiment there is provided a radio frequency module comprising a temperature controlled attenuator circuit and an amplifier, the temperature controlled attenuator circuit having a temperature sensor circuit for sensing the temperature of the amplifier and generate a control voltage inversely proportional to a difference in temperature between an ambient temperature and the temperature of the amplifier, and a variable attenuator circuit configured to attenuate an output of the amplifier, the variable attenuator circuit further configured to vary its attenuation based upon the control voltage to provide an attenuation based upon the difference in temperature between the ambient temperature and the temperature of the amplifier.

In one example, the temperature controlled attenuator circuit is configured such that the variable attenuator circuit compensates for gain droop over time of the amplifier as the temperature of the amplifier increases during use.

In one example, the temperature controlled attenuator circuit is configured to provide less attenuation as the temperature of the amplifier increases.

In one example, the temperature sensor circuit has a first transistor configured to be thermally isolated from the amplifier and being configured to sense the ambient temperature, and a second transistor configured to be thermally linked to the amplifier and being configured to sense the temperature at the amplifier, the temperature sensor circuit being a differential circuit having a first path and a second path with the first and second transistors being arranged on the first and second paths of the differential circuit, respectively, such that the temperature sensor circuit generates the control voltage inversely proportional to a temperature difference between the ambient temperature and the temperature at the amplifier.

In one example, the variable attenuator circuit has a plurality of varactor diodes configured to attenuate an RF signal between an RF input and an RF output, a reference voltage input, and a control voltage input configured to vary the attenuation of the variable attenuator circuit based upon the control voltage.

In one example, the control voltage is configured to vary the attenuation of the variable attenuator circuit by changing the capacitances of one or more of the plurality of varactor diodes.

According to another embodiment there is provided a wireless device comprising a temperature controlled attenuator circuit and an amplifier, the temperature controlled attenuator circuit having a temperature sensor circuit for sensing the temperature of the amplifier and generate a control voltage inversely proportional to a difference in temperature between an ambient temperature and the temperature of the amplifier, and a variable attenuator circuit configured to attenuate an output of the amplifier, the variable attenuator circuit further configured to vary its attenuation based upon the control voltage to provide an attenuation based upon the difference in temperature between the ambient temperature and the temperature of the amplifier.

In one example, the temperature controlled attenuator circuit is configured such that the variable attenuator circuit compensates for gain droop over time of the amplifier as the temperature of the amplifier increases during use.

In one example, the temperature controlled attenuator circuit is configured to provide less attenuation as the temperature of the amplifier increases.

In one example, the temperature sensor circuit has a first transistor configured to be thermally isolated from the amplifier and being configured to sense the ambient temperature, and a second transistor configured to be thermally linked to the amplifier and being configured to sense the temperature at the amplifier, the temperature sensor circuit being a differential circuit having a first path and a second path with the first and second transistors being arranged on the first and second paths of the differential circuit respectively such that the temperature sensor circuit generates the control voltage inversely proportional to a temperature difference between the ambient temperature and the temperature at the amplifier.

In one example, the variable attenuator circuit has a plurality of varactor diodes configured to attenuate an RF signal between an RF input and an RF output, a reference voltage input, and a control voltage input configured to vary the attenuation of the variable attenuator circuit based upon the control voltage.

In one example, the control voltage is configured to vary the attenuation of the variable attenuator circuit by changing the capacitances of one or more of the plurality of varactor diodes.

Still other aspects, embodiments, and advantages of these exemplary aspects and embodiments are discussed in detail below. Embodiments disclosed herein may be combined with other embodiments in any manner consistent with at least one of the principles disclosed herein, and references to "an embodiment," "some embodiments," "an alternate embodiment," "various embodiments," "one embodiment," or the like are not necessarily mutually exclusive and are intended to indicate that a particular feature, structure, or characteristic described may be included in at least one embodiment. The appearances of such terms herein are not necessarily all referring to the same embodiment.

BRIEF DESCRIPTION OF THE DRAWINGS

Various aspects of at least one embodiment are discussed below with reference to the accompanying figures, which are not intended to be drawn to scale. The figures are included to provide illustration and a further understanding of the various aspects and embodiments, and are incorporated in and constitute a part of this specification, but are not intended as a definition of the limits of the invention. In the figures, each identical or nearly identical component that is illustrated in various figures is represented by a like numeral. For purposes of clarity, not every component may be labeled in every figure. In the figures:

FIG. 12A is a graph comparing attenuation with output power across different ambient temperatures;

FIG. 12B is a graph comparing attenuation with output power across different frequencies;

DETAILED DESCRIPTION

Figure 1:
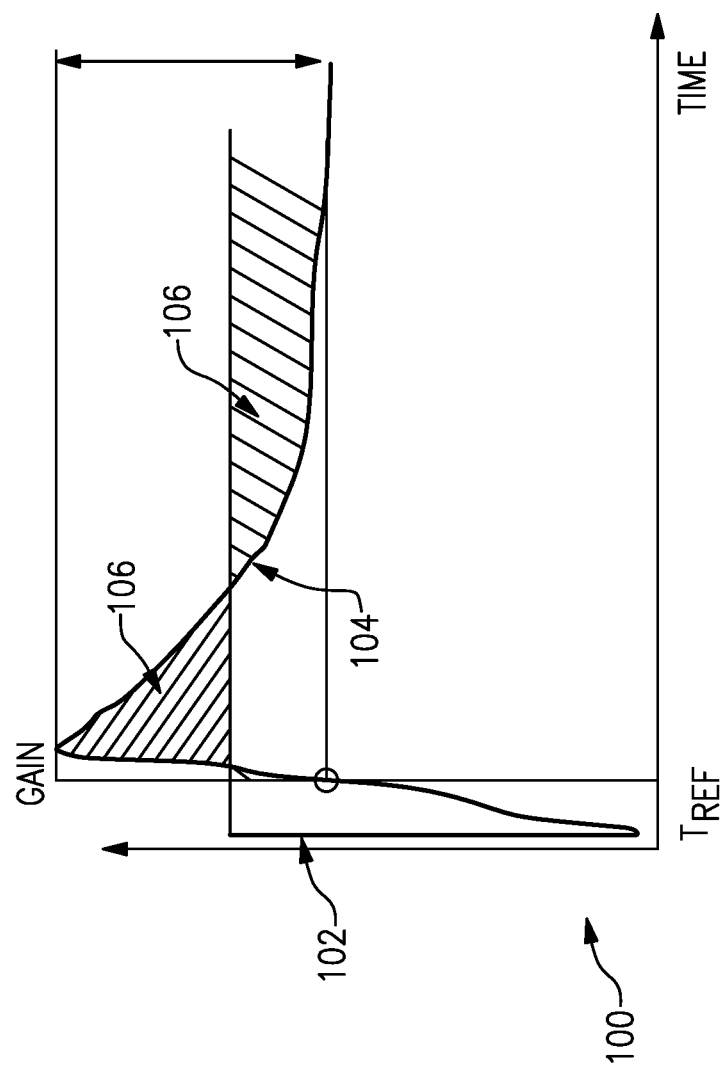
FIG. 1 is a graph comparing an ideal gain plot and a practical gain plot.

Aspects and embodiments described herein are directed to an amplifier circuit for providing improved gain compensation. Embodiments described herein may provide advantages non-exhaustively including the following: improved gain compensation; improved linearity; improved EVM; less sensitivity to device or component placement and allowing for additional parameters for tuning gain compensation; reduced process sensitivity; less sensitivity to die attach and other environmental factors; and faster design cycle.

It is to be appreciated that embodiments of the methods and apparatuses discussed herein are not limited in application to the details of construction and the arrangement of components set forth in the following description or illustrated in the accompanying drawings. The methods and apparatuses are capable of implementation in other embodiments and of being practiced or of being carried out in various ways. Examples of specific implementations are provided herein for illustrative purposes only and are not intended to be limiting. Also, the phraseology and terminology used herein is for the purpose of description and should not be regarded as limiting. The use herein of "including," "comprising," "having," "containing," "involving," and variations thereof is meant to encompass the items listed thereafter and equivalents thereof as well as additional items. References to "or" may be construed as inclusive so that any terms described using "or" may indicate any of a single, more than one, and all of the described terms.

Long signal bursts of 4 ms and 5 ms length have become standard for more advanced wireless communication networks such as WiFi networks to meet the increased demand for data transfer across such wireless networks. This poses a challenge for WiFi power amplifiers (PA) as there is a large thermally dependent gain response as the amplifier heats up during the signal burst. Essentially, the amplifier experiences a gain "droop" over time as the amplifier heats up due to the properties of the semiconductor and passive components changing with temperature, resulting in less gain from the warmer amplifier. This in turn limits performance by setting a lower limit on the Dynamic Error Vector Magnitude (DEVM) that the amplifier can achieve. To achieve low levels of Error Vector Magnitude (EVM), for example −47 dB maximum level for 802.11ax networks, the gain delta or change over a 5 ms burst should remain under 0.045 dB.

Advantageously, embodiments of systems and methods for temperature compensated power amplifier gain compensation disclosed herein can be applied to a variety of amplifiers, such as power amplifiers, low noise amplifiers, pulse amplifiers, driver amplifiers, instrumentation amplifiers, gain blocks, or any amplifier in which excellent short-term stability is desired. Furthermore, the embodiments disclosed herein compensate for gain droop exhibited by amplifiers that are heating up without the need to know how quickly the temperature of the amplifier is changing (for example, the thermal environment of the amplifier need not be known a priori).

FIG. 1 illustrates a comparison graph 100 showing an ideal gain plot and a practical gain plot. A first plot 102 provides ideal gain performance: when the amplifier is turned on, the ideal amplifier immediately reaches a peak gain value and maintains the peak gain value indefinitely. In comparison, a second plot 104 provides an example of practical gain performance: when the amplifier turns on, there is a period of delay before the amplifier ramps up to a peak gain value and gradually decreases from the peak gain value over time. Practical gain performance as illustrated by the second plot 104 creates various instances of error 106, or in other words, differences from the ideal gain performance of the amplifier. Error 106 is measured in FIG. 1 beyond a $t_{ref}$ (e.g., the beginning of preamble) point. It is advantageous to minimize the error as much as possible for an amplifier.

Embodiments described herein provide circuits and/or methods for reducing gain error, and particularly for compensating for gain droop. In some embodiments, an amplifier or power amplifier circuit may be configured to self-correct and/or otherwise respond to heating at an amplifier network of the power amplifier. Moreover, a power amplifier may include various devices configured to detect heating at and/or near the amplifier network. Responses to heating may be performed automatically in response to detected heating. Some embodiments may be configured for use with multistage (e.g., two or more amplification stages) while some embodiments may be configured for use with single-stage amplifiers as well or alternatively.

In embodiments disclosed herein, gain droop can be corrected by providing a varying attenuation to the output signal of an amplifier. This can be done responsive to the temperature of the amplifier such that the relative change in gain applied to a signal by an amplifier over time is decreased. As can be seen in FIG. 1, the gain peaks shortly after the amplifier is activated then decreases over time as the amplifier heats. Providing a relatively large attenuation to the signal initially and then decreasing the attenuation over time can level out the applied gain such that it is more constant over time. A variable attenuator and a temperature sensor circuit can be used to achieve this effect.

Figure 2:
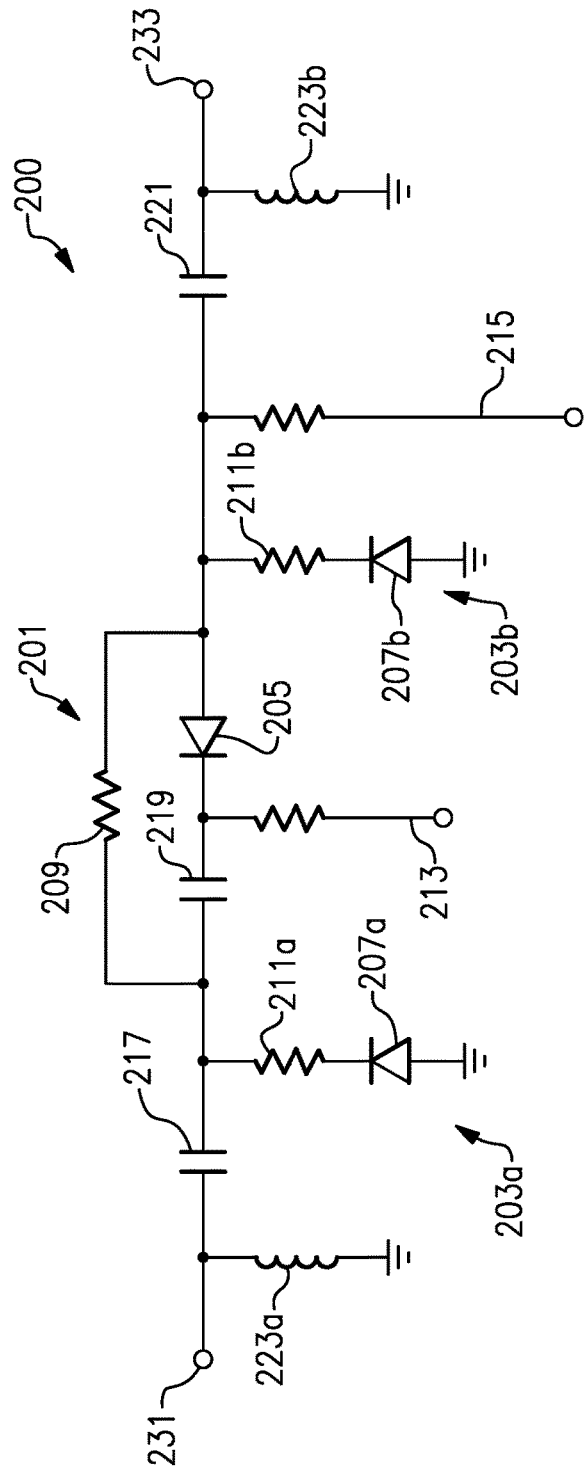
FIG. 2 is a variable attenuator according to aspects disclosed herein.

FIG. 2 illustrates a variable attenuator 200 according to an embodiment disclosed herein. The variable attenuator comprises a plurality of varactor diodes 205, 207 configured to attenuate a radio frequency signal between an RF input 231 and an RF output 233. The attenuation that the variable attenuator 200 applies to a radio frequency signal between the RF input 231 and the RF output 233 is controlled through a control voltage input 215 and a reference voltage input 213. By varying the voltage at the control voltage input 215 with respect to the reference voltage input 213, the attenuation of the variable attenuator 200 can be adjusted (i.e., increased or decreased).

The variable attenuator 200 comprises three varactor diodes 205, 207*a*, 207*b* arranged in a pi formation. That is, the variable attenuator 200 is a pi-type configuration attenuator. The variable attenuator 200 comprises a series varactor diode 205 and two shunt varactor diodes 207*a*, 207*b*. The two shunt varactor diodes 207*a*, 207*b* are connected to ground on either side of the series varactor diode. Each shunt arm 203*a*, 203*b* (i.e., the portions with each of the shunt diodes 207*a*, 207*b*) also comprises a resistor 211*a*, 211*b* in series with the varactor diode 207*a*, 207*b*. A further resistor 209 is provided in parallel with the series varactor diode 205 to provide the series portion 201 of the pi-configuration variable attenuator 200.

The series elements of the variable attenuator 200, that is the varactor diode 205 and resistor 209 determine the level of attenuation applied to a radio frequency signal between the RF input 231 and the RF output 233. Varactor diodes have a capacitance, and by varying the capacitance of the series varactor diode 205 the attenuation can be adjusted. In the variable attenuator 200, the capacitance of varactor diode 205 is determined by the difference between the control signal applied at the control voltage input 215 and the reference voltage applied at the reference voltage input 213. Accordingly, as noted above, the attenuation of variable attenuator 200 is set based on a control signal applied at the control voltage input 215.

The shunt elements, varactor diodes 207a, 207b and resistors 211a, 211b, maintain the impedance presented by the variable attenuation circuit 200. It is important that the impedance presented by the variable attenuation circuit 200 is maintained at a constant (or approximately constant) value (for example, 50 Ohms) because other components such as amplifiers require a specific impedance for them to function optimally (e.g., in a linear regime). In the variable attenuator 200, the capacitance of varactor diodes 207a, 207b is determined by the difference between the control signal applied at the control voltage input 215 and the reference voltage applied at the reference voltage input 213. Accordingly, as noted above, the impedance of the variable attenuator 200 is set based on a control signal applied at the control voltage input 215.

As the input voltage applied at the control voltage input 215 varies the voltage across the series varactor diode 205 changes in an opposite direction from the voltage across the shunt varactor diodes 207. The varactor diodes 205, 207 are reverse biased, and as such when the voltage across them increases, their capacitance goes down. Accordingly, as the voltage across the series varactor diode 205 decreases, so does the attenuation provided by the variable attenuator 200. Meanwhile, the voltage across the shunt varactor diodes 207 increases to maintain the impedance of the variable attenuator 200.

The variable attenuator 200 also comprises a number of blocking capacitors, capacitors 217, 219, and 221. These capacitors 217, 219, 221 prevent the DC voltage of the variable attenuator 200 from escaping from the RF input 231 and the RF signal output 233. These capacitors 217, 219, and 221 should be large to not attenuate the RF signal. Preferably, the blocking capacitors 217, 219, and 221 should be as large as can be accommodated based on design and cost constraints.

Inductors 223a and 223b are also provided. This is because there is a capacitive element to the impedance presented at the RF input 231 and RF output 233 of the variable attenuator 200. Providing inductors 223 in parallel to ground generates inductances to cancel out this capacitance, which reduces the return loss of the variable attenuator 200.

Figure 3:
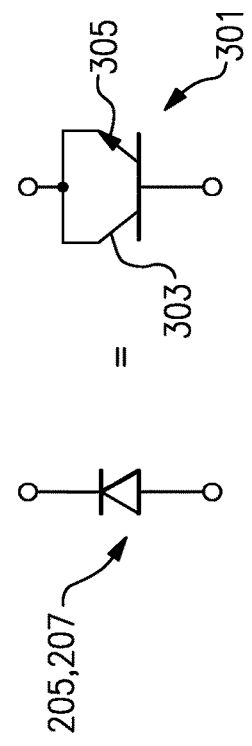
FIG. 3 is a diode connected transistor.
Figure 4:
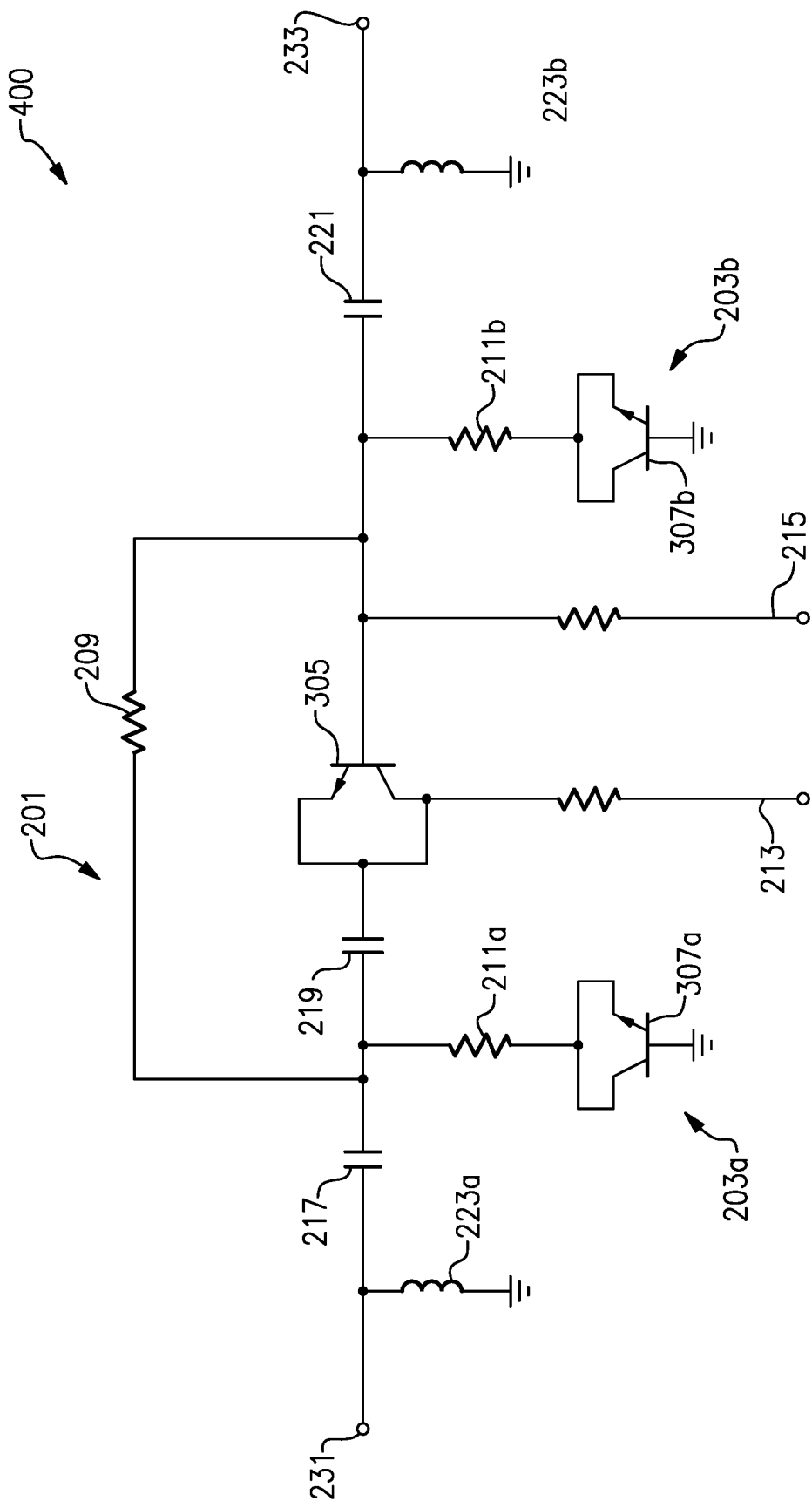
FIG. 4 is a variable attenuator according to aspects disclosed herein.

The varactor diodes 205, 207 of the variable attenuator 200 illustrated in FIG. 2 can be implemented as transistors 301 having their emitter 305 and collector 303 connected. Such a configuration is illustrated in FIG. 3, and can be advantageous due to the ability to easily incorporate such components into integrated circuits and existing processes. FIG. 4 illustrates a variable attenuator, such as that disclosed in FIG. 2, whereby the varactor diodes are implemented as transistors 305, 307 as shown in FIG. 3.

Figure 5:
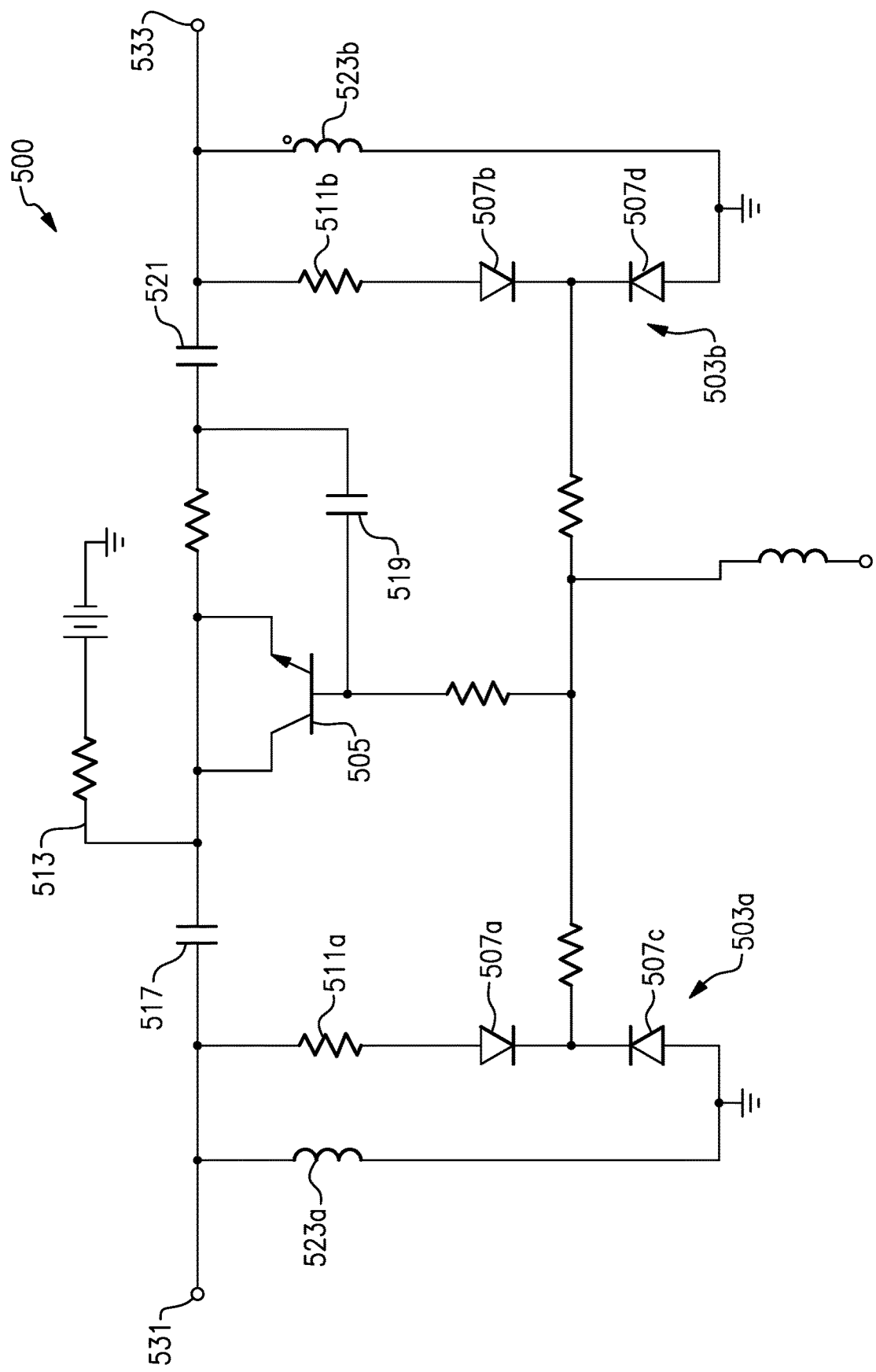
FIG. 5 is a variable attenuator according to aspects disclosed herein.

Another variable attenuator 500 according to an embodiment disclosed herein is illustrated in FIG. 5. The variable attenuator 500 has a number of similar or corresponding components to variable attenuator 200, and corresponding reference numerals have been used for such components.

Whilst many aspects may be similar, one difference between the variable attenuator 500 and the variable attenuator 200 is that the variable attenuator 500 comprises back-to-back varactor diodes 507a and 507c, 507b and 507d in the shunt portions 503a, 503b. The back-to-back varactor diodes 507a and 507c, 507b and 507d are pairs of varactor diodes arranged in series in opposite directions, as illustrated in FIG. 5. This arrangement of varactor diodes 507a and 507c, 507b and 507d provides a more linear variation in capacitance with voltage than just using a single varactor diode, as in FIG. 2, as well as making the variable attenuator 500 more tolerant of high signal levels. On the other hand, using back-to-back varactor diodes 507 increases the size and complexity of the variable attenuator 500.

The use of varactor diodes in the variable attenuators of FIGS. 2, 4, and 5 gives a very linear attenuation, though they limit the attenuation range of the variable attenuators to the order of 2 or 3 dB. Therefore, such an attenuator is particularly suited to implementations where only relatively small variations in attenuation are desired, typically of the order of 1 dB or less. The typical gain droop of an amplifier due to its increasing temperature during use is around 0.5 dB or less. It can, therefore, be seen that the variable attenuators of FIGS. 2, 3, and 5 are suitable for such implementations.

Figure 6:
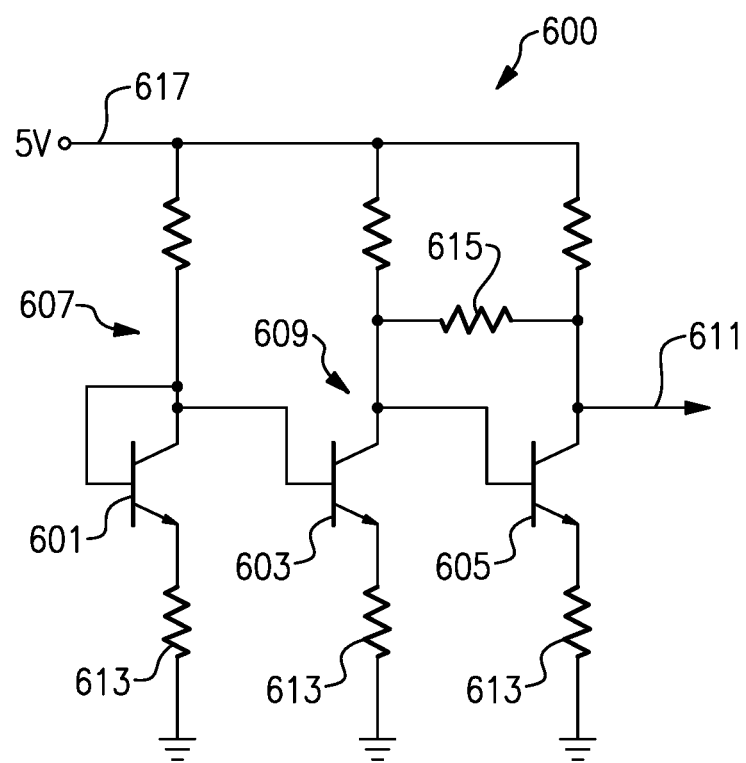
FIG. 6 is a temperature sensor circuit according to aspects disclosed herein.

FIG. 6 illustrates a temperature sensor circuit 600 according to an embodiment disclosed herein. The temperature sensor circuit 600 is a bandgap reference temperature to voltage circuit. The temperature sensor receives an input reference voltage at 617. The temperature sensor circuit 600 comprises a first transistor 601 configured to be kept at an ambient temperature (i.e., that is thermally isolated from a component that is to have its temperature measured, such as an amplifier (not shown)). The temperature sensor circuit 600 also comprises a second transistor 603 that is configured to be at the same temperature as the component that is to have its temperature measured (i.e., it is thermally linked to the component). The temperature sensor circuit 600 is arranged as a differential circuit having a first path 607 and a second path 609, with the first transistor 601 and second transistor 603 being arranged on the first path 607 and second path 609 of the differential circuit 600, respectively. The differential circuit is formed by having the collector and the base of the first transistor 601 coupled together, and the collector of the first transistor 601 also coupled to the base of the second transistor 603.

The temperature sensor circuit 600 also comprises a third transistor 605. The collector of the second transistor 603 is coupled to the base of the third transistor, whilst an output voltage is taken from the collector of the third transistor 605 at 611. The first 601, second 603, and third transistors 605 each have their emitters connected to ground via emitter resistors 613.

A resistor 615 is also provided between the collector of the second transistor 603 and the collector of the third transistor 605. This resistor 615 can be used to vary the temperature response of the temperature sensor circuit 600. Using a larger resistor as resistor 615 makes the temperature sensor circuit 600 more responsive to temperature variations between the first 601 and second transistors 603. Conversely, using a smaller resistor as resistor 615 makes the temperature sensor circuit 600 less responsive to temperature variations between the first 601 and second 603 transistors. It is also noted that the emitter resistors 613 can also (or alternatively) be used to vary the sensitivity of the temperature sensor circuit 600. Using larger emitter resistors 613 makes the temperature sensor circuit 600 less responsive to temperature variations between the first 601 and second transistors 603. Conversely, using smaller emitter resistors 613 makes the temperature sensor circuit 600 more responsive to temperature variations between the first 601 and second 603 transistors.

Figure 7:
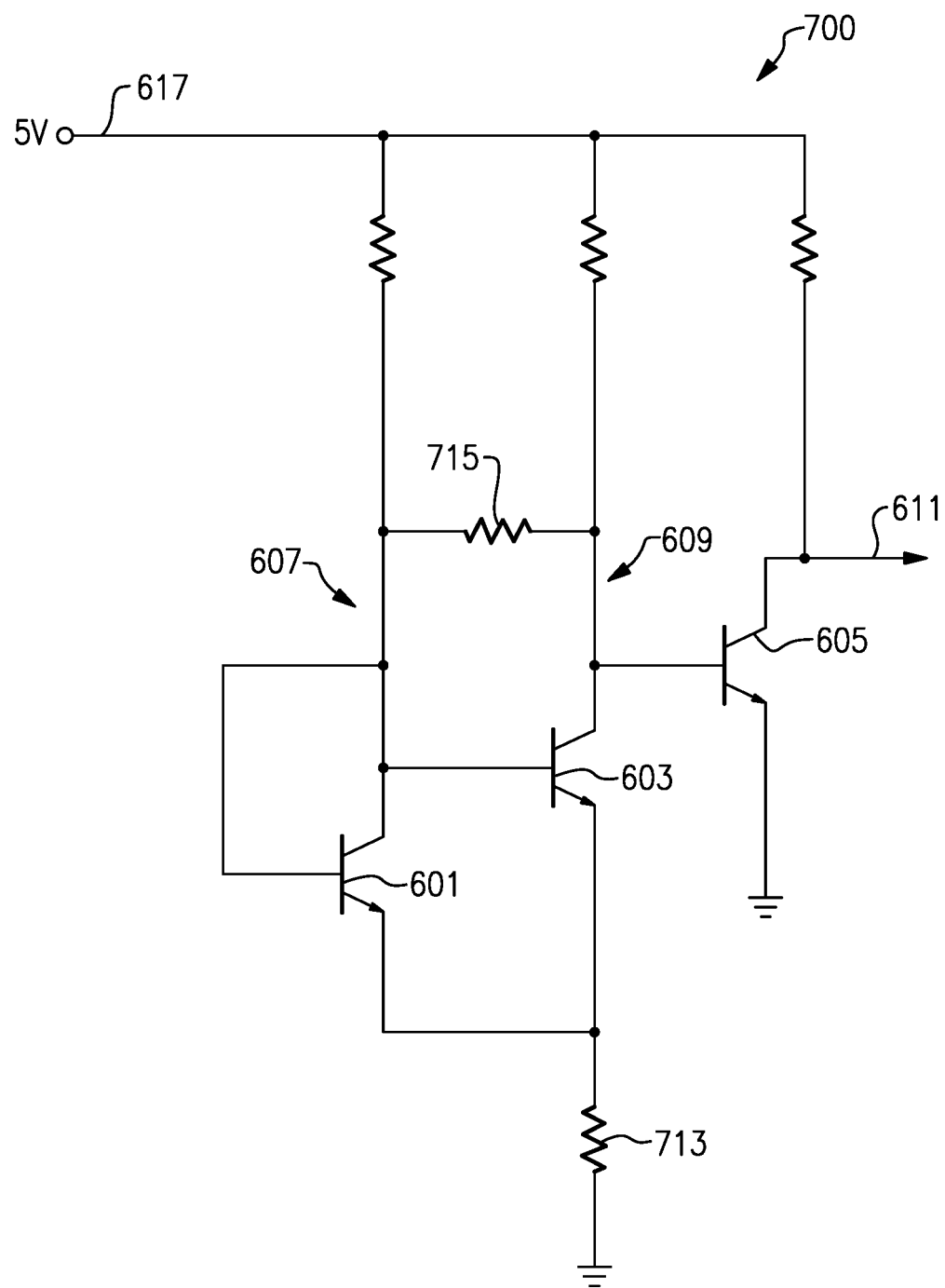
FIG. 7 is a temperature sensor circuit according to aspects disclosed herein.

FIG. 7 also shows a temperature sensor circuit 700 according to an embodiment disclosed herein. The temperatures sensor circuit 700 of FIG. 7 is a differential circuit having many of the same components as the temperature sensor circuit 600 of FIG. 6.

One difference between temperature sensor circuit 700 and the temperature sensor circuit 600, however, is that a resistor 715 is provided between the collectors of the first transistor 601 and the second transistor 603 (i.e., between the first path 607 and the second path 609) rather than between the collectors of the second transistor 603 and the third transistor 605. As with the resistor 615 of temperature sensor circuit 600, the resistor 715 of the temperatures sensor circuit 700 can be used to set the sensitivity of the temperature sensor circuit 700. Using a larger resistor as resistor 715 makes the temperature sensor circuit 700 more responsive to temperature variations between the first 701 and second transistors 703. Conversely, using a smaller resistor as resistor 715 makes the temperature sensor circuit 700 less responsive to temperature variations between the first 701 and second 703 transistors. It will be appreciated that in some embodiments two resistors can be provided, one between the collectors of the first transistor 601 and the second transistor 603 (like resistor 715 in FIG. 7) and the other between the collectors of the second transistor 603 and the third transistor 605 (like resistor 615 in FIG. 6).

Another difference is that a single emitter resistor 713 is provided between the emitters of the first 601 and second transistors 603. Again, this emitter resistor 713 can also (or alternatively) be used to set the sensitivity of the temperature sensor circuit 700. Using a larger emitter resistor 713 makes the temperature sensor circuit 700 less responsive to temperature variations between the first 701 and second transistors 703. Conversely, using a smaller emitter resistor 713 makes the temperature sensor circuit 700 more responsive to temperature variations between the first 701 and second 703 transistors.

Temperature sensor circuits, such as the temperature sensor circuit 600 and the temperature sensor circuit 700, can also comprise a shut-off switch. A shut-off switch enables the temperature sensor circuit to be deactivated when not needed and activated when needed, thereby saving power when compared to a temperature sensor circuit that is always in an active state.

Figure 8:
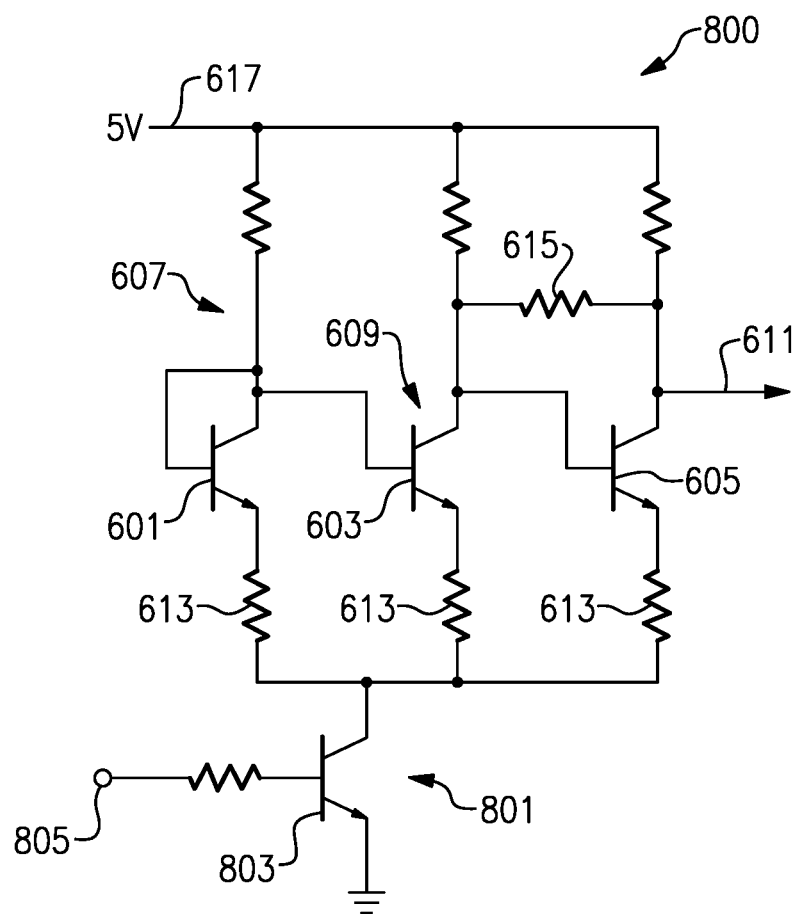
FIG. 8 is a temperature sensor circuit according to aspects disclosed herein.

FIG. 8 illustrates a temperature sensor circuit 800 comprising a shut-off switch 801. The temperature sensor circuit 800 is identical to temperature sensor circuit 600 shown in FIG. 6, with the exception of the additional shut-off switch 801. Accordingly, the temperature sensor circuit 800 functions in the same manner as the temperature sensor circuit 600, with the additional functionality of the shut-off switch 801 which will now be discussed.

The shut-off switch 801 is connected to each of the first 601, second 603, and third transistors 605 via the emitter resistors 613, between the emitter resistors 613 and ground. The shut-off switch 801 comprises a transistor 803 to which a control voltage is applied at 805. The control voltage is used to activate or deactivate the transistor 803 which in turn activates or deactivates the temperature sensor circuit 800. Applying a high voltage at 805 activates the temperature sensor circuit 800 whilst applying a low voltage at 805 deactivates the temperature sensor circuit 800.

The use of a shut-off switch 801 enables the temperature sensor circuit 800 to only be activated when desired, reducing its power consumption. Furthermore, only activating the temperature sensor circuit 800 when desired may have other benefits, such as a longer operational life of the temperature sensor circuit 800 and reduced heat generation by the temperature sensor circuit 800. Additionally, as the temperature sensor circuit 800 can be used to control other circuits and components via the output voltage, further power savings (and other associated benefits) can be found through reducing the unnecessary operation of these controlled circuits and components when they are not needed.

Figure 9:
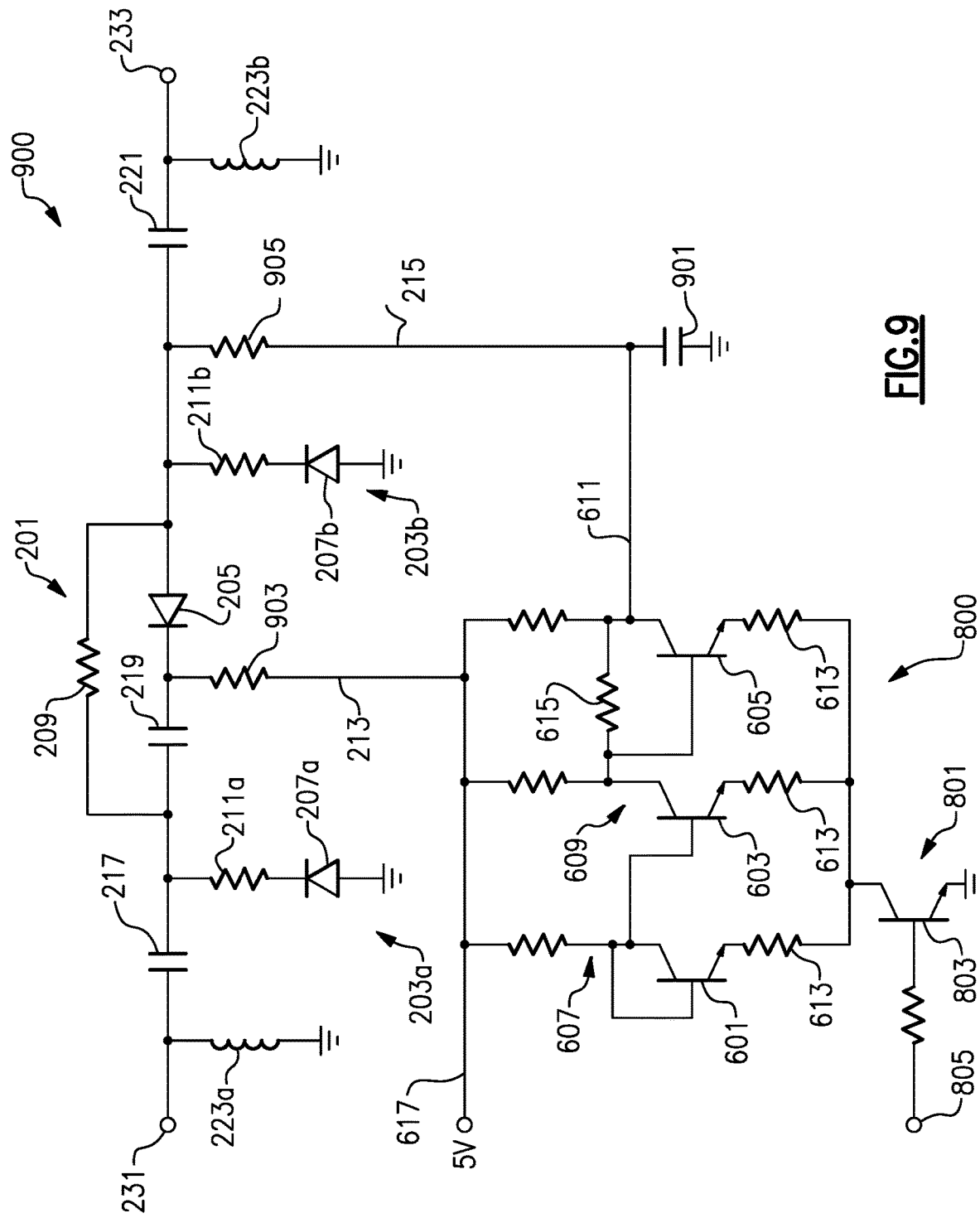
FIG. 9 is a temperature controlled attenuator according to aspects disclosed herein.

A temperature controlled variable attenuator is also provided by embodiments disclosed herein. FIG. 9 illustrates such a temperature controlled variable attenuator 900. The temperature controlled variable attenuator 900 comprises the variable attenuator 200 of FIG. 2 and the temperature sensor circuit 800 of FIG. 8. The components of the variable attenuator 200 and temperature sensor circuit 800 are described above and so are not repeated again here.

In order that the temperature sensor circuit 800 can control the variable attenuator 900, the output 611 of the temperature sensor circuit 800, taken from the collector of the third transistor 605, is connected to the control voltage input 215 of the variable attenuator 900. The reference voltage input 213 of the variable attenuator 900 is connected to the input of the reference voltage 617 of the temperature sensor circuit 200. A capacitor 901 is provided connected between the control voltage input 215 and ground to decouple the radio frequency signal passing from the RF input 231 to the RF output 233 from the temperature sensor circuit 800. Resistors 903 and 905 are also provided, which provide a radio frequency block between the variable attenuator 900 and the temperature sensor circuit 800.

In operation, the first transistor 601 of the temperature sensor circuit 800 is located at an ambient temperature whilst the second transistor 603 is located at an electronic component for which the temperature is to be measured. The attenuation of the variable attenuator 900 will, therefore, be dependent upon the temperature of the electronic component (relative to the ambient temperature). In particular, the temperature controlled variable attenuator 900 may be coupled to an amplifier to correct for gain droop due to heating of the amplifier during use.

The output of the amplifier can be connected to the RF input 231 of the variable attenuator 200. Meanwhile, the second transistor 603 of the temperature sensor circuit 800 is thermally linked to the amplifier (e.g., by being in close proximity to, or having a thermal bridge between). In this manner, the signal output by the amplifier is attenuated by an amount dependent on the temperature of the amplifier.

Going into more detail, when the amplifier is active, amplifying a radio frequency signal, it heats up. This correspondingly raises the temperature of the second transistor 603, which is thermally coupled to the amplifier, relative to the first transistor 601. As the temperature of the second transistor 603 increases relative to the first transistor 601, the voltage output from the temperature sensor circuit 800 at 611 increases. This increase in output voltage reduces the voltage across the series varactor diode 205, which is the difference between the reference voltage and the output voltage of the temperature sensor circuit 800. A lower voltage across the series varactor diode 205 decreases the attenuation of the variable attenuation circuit 200, and hence as the temperature of the amplifier increases the attenuation to the output radio frequency signal from the amplifier decreases.

Therefore, with reference to the graph of FIG. 1 illustrating how the attenuation of an amplifier drops over time as the amplifier heats up, the greatest amount of attenuation is provided by the variable attenuator 200 when the amplifier is cold (i.e., at ambient temperature), whereas less attenuation is provided as the amplifier heats up. By configuring the temperature controlled attenuation circuit 900, this decrease in attenuation as the amplifier heats up can be matched (at least to some extent) to the decrease in amplification as the amplifier heats up (gain droop). That is, the greatest attenuation can be applied when the output of the amplifier is largest and the least attenuation can be applied when the output of the amplifier is lowest. In this manner, the gain droop of the amplifier can be countered to provide a more constant level of amplification by the amplifier during the length of the signal burst.

It should be noted that whilst FIG. 9 illustrates a temperature controlled attenuation circuit 900 comprising the variable attenuator 200 of FIG. 2 and the temperature sensor circuit 800 of FIG. 8, other variable attenuators and temperature sensor circuits could be used. For example, the variable attenuators of FIG. 4 or 5 could be used, or other variable attenuators. Likewise, the temperature sensor circuits of FIG. 6 or 7 could be used, or other temperature sensor circuits.

Figure 10:
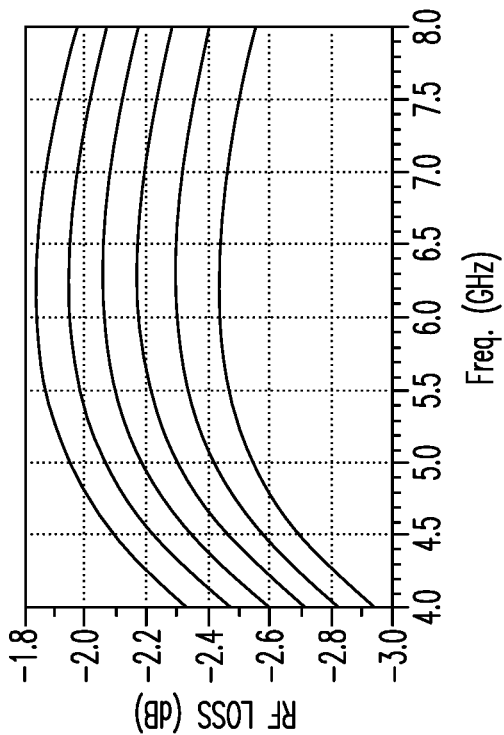
FIG. 10 is a graph comparing attenuation with frequency across different temperatures differences.

FIG. 10 illustrates how the attenuation of the temperature controlled variable attenuator varies with frequency across different temperature differences. The bottom line shows the case wherein the temperature difference measured by the temperature sensor circuit (i.e., the difference between the temperature of the first transistor 601 and the second transistor 603 in FIG. 9) is zero (i.e., no temperature difference) whilst the top line corresponds to a temperature difference of ten degrees C. The lines in between correspond to temperature increments of two degrees C.

As can be seen, the difference in attenuation for different temperatures (relative to ambient temperature) as the frequency of the attenuated signal is varied is approximately constant. That is, the temperature response of the attenuation circuit is approximately linear in this temperature range. In this case, the change in attenuation over a ten degree temperature increase (from a difference of zero to ten degrees C.) is approximately a 0.6 dB drop. As previously noted, this is of the order of magnitude of gain droop of an amplifier as temperature increases, and so a 0.6 dB excess in gain provided by a cold amplifier (i.e., ambient temperature) can be counteracted by 0.6 dB greater attenuation provided by the temperature controlled attenuation circuit when the amplifier is cold.

Figure 11:
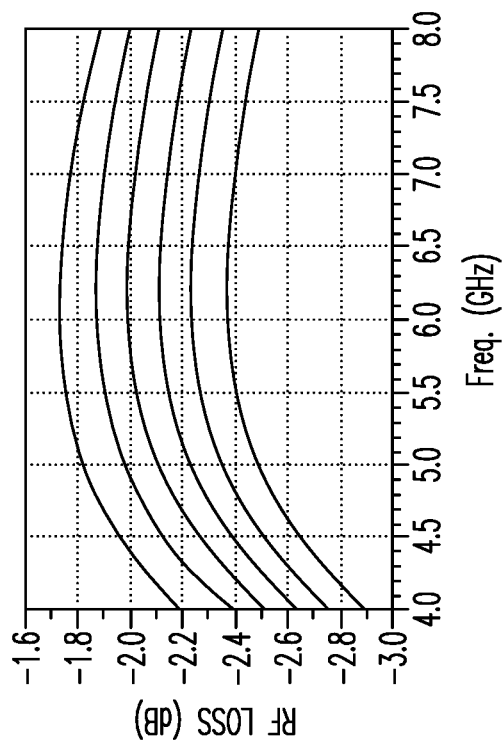
FIG. 11 is a graph comparing attenuation with frequency across different temperatures differences.

FIG. 11 shows the same plot as FIG. 10 but wherein the resistor that sets the sensitivity of the temperature control circuit (e.g., resistor 615 in FIG. 9) has a larger resistance. Specifically, the resistor is increased from 20 kΩ to 50 kΩ. In all other respects, the temperature controlled attenuation circuit to which FIG. 11 corresponds is identical to the temperature controlled attenuation circuit that FIG. 10 corresponds to.

Also unlike FIG. 10, each line in FIG. 11 represents a one degree increase in the measured temperature difference from the ambient temperature (rather than a two degree increase) at the component having its temperature measured (e.g., the amplifier). The bottom line again is a zero degree difference (i.e., the component is at ambient temperature), and so the top line represents a five degree increase in temperature. This is in contrast to the top line in FIG. 11 which represents a ten degree increase in temperature.

It can be seen in FIG. 11 that difference in attenuation between the top and bottom lines (i.e., over a five degree temperature increase from ambient temperature) is again around 0.6 dB. Comparing this to FIG. 10, it can be seen that increasing the resistance of the resistor that sets the sensitivity of the temperature control circuit (e.g., resistor 615 in FIG. 9) increases the sensitivity of the temperature controlled attenuation circuit to changes in temperature, causing it to provide the same attenuation (around 0.6 dB) over less temperature range (a five degree temperature change rather than ten).

This illustrates how, by adjusting the resistance of resistors in the temperature control circuit of the temperature controlled attenuator, such as resistor 615 in FIG. 9, the temperature controlled attenuator can be tailored based upon the gain droop of an amplifier so that it can, at least in part, correct for the gain droop to provide a more stable level of gain. In some embodiments, the resistance of this resistor can be set by trimming the resistor with a laser. This can enable a precise resistance value to be achieved.

FIGS. 12A and 12B illustrate the response of the temperature controlled attenuation circuit of FIG. 9 at different ambient temperatures and across different frequencies, respectively. Both FIGS. 12A and 12B plot the attenuation on the y-axis in dB and the output power of the attenuated RF signal from the RF output 223 on the x-axis in dBm.

In FIG. 12A, five lines are shown showing the attenuation at different temperatures from −40 degrees (bottom) to +120 degrees C. (top). Firstly, it is noted that the attenuation at a given temperature is approximately constant from below −20 dBm to around +10 dBm. Secondly, the attenuation only varies by approximately 0.06 dB between the two temperature extremes, from around −2.11 dB to about −2.17 dB. Accordingly, it can be seen that the temperature controlled attenuator is able to provide attenuation largely independent from the ambient temperature and instead only affected by the measured temperature difference from the ambient temperature.

In FIG. 12B, three lines show the attenuation at different frequencies from 5.15 GHz (bottom) to 5.85 GHz (top). Across these frequencies, the attenuation varies from about −2.12 dB by around 0.06 dB to about −2.18 dB. It can be seen that the temperature controlled attenuator is also able to provide approximately constant attenuation across a wide range of frequencies of RF signal.

Figure 13:
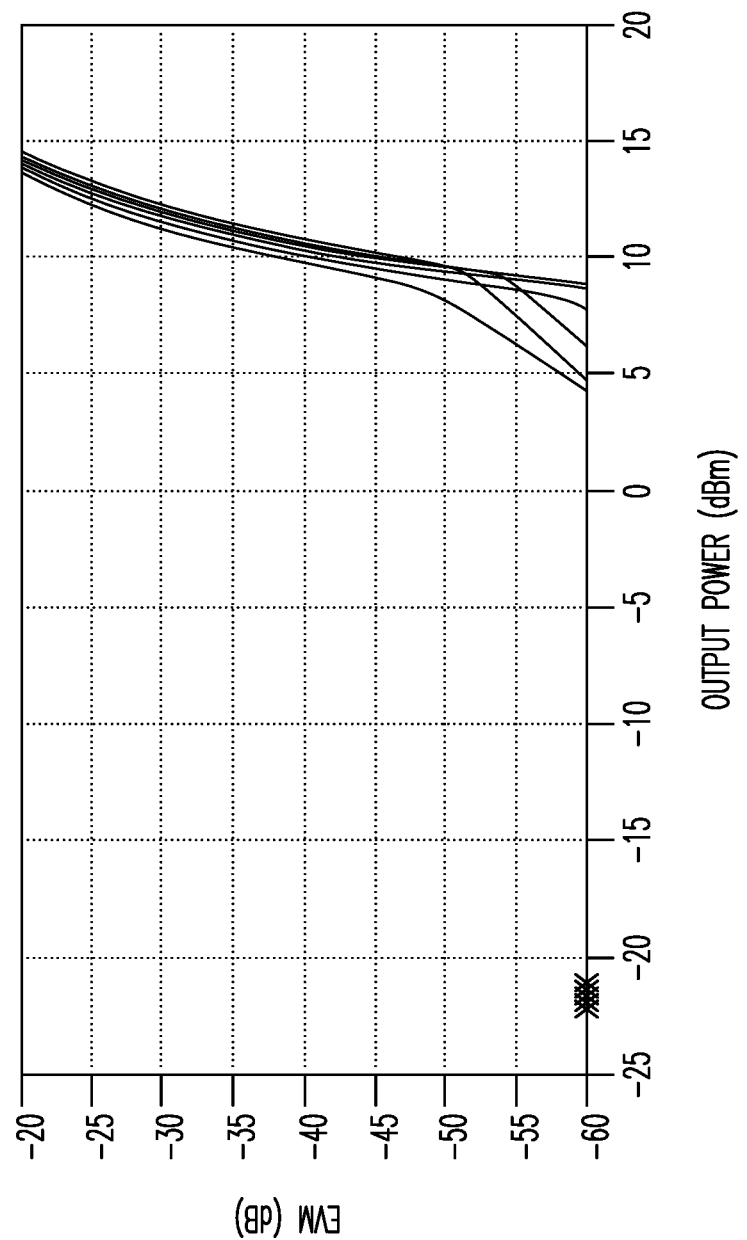
FIG. 13 is a chart illustrating the error vector magnitude of the temperature controlled attenuator of FIG. 9 at different measured temperature differences.

FIG. 13 illustrates the error vector magnitude (EVM), a measure of linearity, of the temperature controlled attenuator of FIG. 9 at different measured temperature differences from zero degrees to ten degrees C. In each case, it can be seen that the EVM is better than −50 dB up to an output power of about 8 dBm.

Figure 14C:
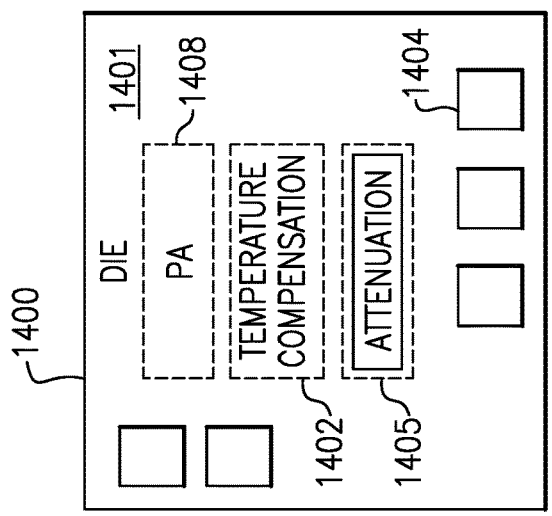
FIG. 14A to 14C are block diagrams of exemplary integrated circuits including an amplifier circuit according to aspects disclosed herein.
Figure 14B:
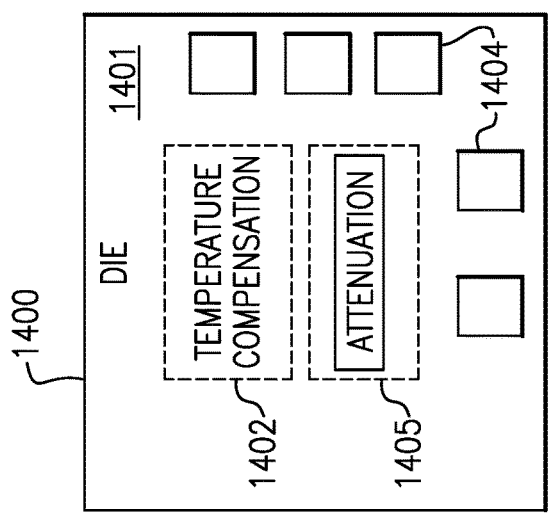
Figure 14A:
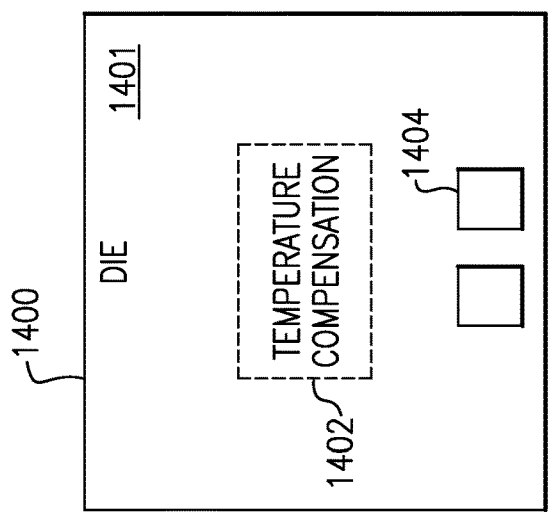

FIGS. 14A to 14C are block diagrams of various integrated circuits (ICs) according to some implementations. While some example features are illustrated, those skilled in the art will appreciate from the disclosure herein that various other features have not been illustrated for the sake of brevity and so as not to obscure more pertinent aspects of the example implementations disclosed herein. To that end, for example, FIG. 14A shows that in some implementations, some or all portions of the temperature compensation circuit 1402, which operates during data bursts, can be part of a semiconductor die 1400. By way of an example, the temperature compensation circuit 1402 can be formed on a substrate 1401 of the die 1400 and comprise a temperature sensor circuit. A plurality of connection pads 1404 can also be formed on the substrate 1401 to facilitate functionalities associated with some or all portions of the temperature compensation circuit 1402.

FIG. 14B shows that in some implementations, a semiconductor die 1400 having a substrate 1401 can include some or all portions of the temperature compensation circuit 1402 and some or all portions of the temperature controlled attenuation circuit 1405. A plurality of connection pads 1404 can also be formed on the substrate 1401 to facilitate functionalities associated with some or all portions of the temperature compensation circuit 1402 and some or all portions of the attenuation circuit 1405.

FIG. 14C shows that in some implementations, a semiconductor die 1400 having a substrate 1401 can include some or all portions of the temperature compensation circuit 1402, some or all portions of the temperature controlled attenuation circuit 1405, and some or all portions of a power amplifier (PA) 1408. A plurality of connection pads 1404 can also be formed on the substrate 1401 to facilitate functionalities associated with some or all portions of the temperature compensation circuit 1402, some or all portions of the attenuation circuit 1405, and some or all portions of the PA 1408. In an embodiment, the die 1400 is a GaAs die integrating the PA 1408 and a controller that includes the temperature compensation circuit 1402 and attenuation circuit 1405.

Figure 15:
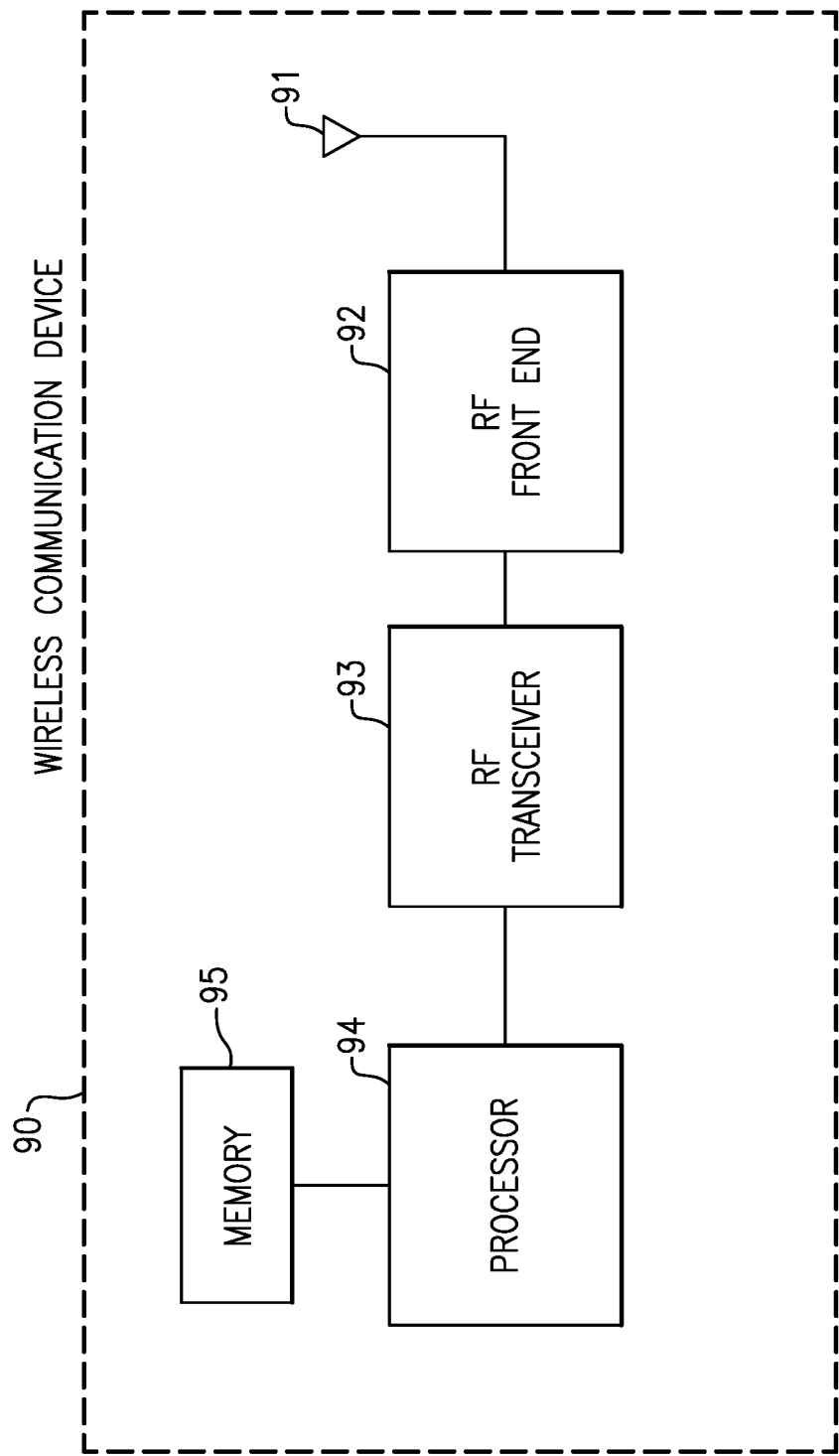
FIG. 15 is a block diagram of a wireless device including an amplifier circuit according to aspects disclosed herein.

FIG. 15 is a block diagram of a wireless device 90, also referred to as a wireless communication device 90. The wireless communication device 90 includes temperature compensated power amplifier attenuation according to an embodiment. The wireless communication device 90 can be any suitable wireless communication device. For instance, a wireless communication device 90 can be a mobile phone such as a smart phone, or a wireless router. As illustrated, the wireless communication device 90 includes an antenna 91, an RF front end 92, a transceiver 93, a processor 94, and a memory 95. The antenna 91 can transmit RF signals provided by the RF front end 92. The antenna 91 can transmit carrier aggregated signals provided by the RF front end 92. The antenna 91 can provide received RF signals to the RF front end 92 for processing.

The RF front end 92 can include one or more power amplifiers, one or more low noise amplifiers, RF switches, receive filters, transmit filters, duplex filters, or any combination thereof. The RF front end 92 can transmit and receive RF signals associated with any suitable communication standards. For instance, the RF front end 92 can provide a carrier aggregated signal to the antenna 91. The temperature compensation circuit discussed herein can adjust a gain of a power amplifier of the RF front end 92. That is, the front end 92 can include the amplifier circuit according to one or more embodiments discussed herein and may have one or more associated advantages as discussed herein, such as modulating attenuation of an output of an amplifier based on a temperature change sensed by the temperature sense circuit in order to compensate for gain droop as an amplifier heats up during a signal burst.

The RF transceiver 93 can provide RF signals to the RF front end 92 for amplification and/or other processing. The RF transceiver 93 can also process an RF signal provided by a low noise amplifier of the RF front end 92.

The RF transceiver 93 is in communication with the processor 94. The processor 94 can be a baseband processor. The processor 94 can provide any suitable base band processing functions for the wireless communication device 90. The memory 95 can be accessed by the processor 94. The memory 95 can store any suitable data for the wireless communication device 90.

Any of the principles and advantages discussed herein can be applied to other systems, not just to the systems described above. The elements and operations of the various embodiments described above can be combined to provide further embodiments. Some of the embodiments described above have provided examples in connection with power amplifiers, packaged modules, and/or wireless communications devices. However, the principles and advantages of the embodiments can be used in connection with any other systems, apparatus, or methods that benefit could from any of the teachings herein. For instance, any of the principles and advantages discussed herein can be implemented in connection with providing temperature compensation for an amplifier that experiences changes in gain over temperature. Any of the principles and advantages discussed herein can be implemented in association with a wireless local area network (WLAN) power amplifier. Any of the principles and advantages discussed herein can be implemented in association with RF circuits configured to process signals in a range from about 30 kHz to 300 GHz, such as in a range from about 450 MHz to 7.125 GHz.

In some cases, the circuits described above may be implemented on gallium arsenide (GaAs) substrates, silicon (Si) substrates, or other substrates, on a single wafer or on multiple wafers. The transistors may be NPN transistors or PNP transistors, depending upon the embodiment and the substrates used.

Aspects of this disclosure can be implemented in various electronic devices. Examples of the electronic devices can include, but are not limited to, consumer electronic products, parts of the consumer electronic products such as semiconductor die and/or packaged radio frequency modules, electronic test equipment, uplink wireless communication devices, personal area network communication devices, etc. Examples of the consumer electronic products can include, but are not limited to, a mobile phone such as a smart phone, a wearable computing device such as a smart watch or an ear piece, a telephone, a television, a computer monitor, a computer, a router, a modem, a hand-held computer, a laptop computer, a tablet computer, a personal digital assistant (PDA), a microwave, a refrigerator, a vehicular electronics system such as an automotive electronics system, a stereo system, a DVD player, a CD player, a digital music player such as an MP3 player, a radio, a camcorder, a camera such as a digital camera, a portable memory chip, a washer, a dryer, a washer/dryer, peripheral device, a clock, etc. Further, the electronic devices can include unfinished products.

Having described above several aspects of at least one embodiment, it is to be appreciated various alterations, modifications, and improvements will readily occur to those skilled in the art. Such alterations, modifications, and improvements are intended to be part of this disclosure and are intended to be within the scope of the invention. Accordingly, the foregoing description and drawings are by way of example only, and the scope of the invention should be determined from proper construction of the appended claims, and their equivalents.

What is claimed is:

1. A temperature controlled attenuator circuit comprising:
   a temperature sensor circuit for sensing a temperature of an electronic component and generating a control voltage inversely proportional to a difference in temperature between an ambient temperature and the temperature of the electronic component; and
   a variable attenuator circuit configured to vary its attenuation based upon the control voltage to provide an attenuation based upon the difference in temperature between the ambient temperature and the temperature of the electronic component.

2. The temperature controlled attenuator circuit of claim 1 wherein the variable attenuator circuit has:
   a plurality of varactor diodes configured to attenuate an RF signal between an RF input and an RF output;
   a reference voltage input; and a control voltage input configured to vary the attenuation of the variable attenuator circuit based upon the control voltage.

3. The temperature controlled attenuator circuit of claim 2 wherein the control voltage is configured to vary the attenuation of the variable attenuator circuit by changing the capacitances of one or more of the plurality of varactor diodes.

4. The temperature controlled attenuator circuit of claim 2 wherein the plurality of varactor diodes is arranged in a T-type or an L-type attenuator configuration.

5. The temperature controlled attenuator circuit of claim 2 wherein the plurality of varactor diodes is arranged in a pi-type attenuator configuration.

6. The temperature controlled attenuator circuit of claim 5 wherein the pi-type attenuator configuration comprises a first varactor diode connected in a series position between the RF input and the RF output and a second varactor diode and a third varactor diode, the second and third varactor diodes each connected in a shunt position either side of the first varactor diode.

7. The temperature controlled attenuator circuit of claim 6 further comprising a first resistor arranged in parallel with the first varactor diode, a second resistor in a shunt position and in series with the second varactor diode, and a third resistor in a shunt position and in series with the third varactor diode.

8. The temperature controlled attenuator circuit of claim 7 wherein the second and third varactor diodes are connected to ground and are arranged in series between the ground connection and the second and third resistors respectively.

9. The temperature controlled attenuator circuit of claim 7 further comprising a first DC blocking capacitor arranged in series with the first varactor diode, optionally such that the first resistor is arranged in parallel with both the first DC blocking capacitor and the first varactor diode.

10. The temperature controlled attenuator circuit of claim 6 further comprising a second DC blocking capacitor arranged between the RF input and the shunt position of the second varactor diode and a first inductor arranged in a shunt position between the second DC blocking capacitor and the RF input.

11. The temperature controlled attenuator circuit of claim 6 further comprising a third DC blocking capacitor arranged between the RF output and the shunt position of the third varactor diode and a second inductor arranged in a shunt position between the third DC blocking capacitor and the RF output.

12. The temperature controlled attenuator circuit of claim 6 wherein at least one of the first, second, and third varactor diodes is formed as a bipolar junction transistor having emitter and collector terminals connected together and the at least one of the first, second, and third varactor diodes formed as a bipolar junction transistor is an NPN bipolar junction transistor.

13. The temperature controlled attenuator circuit of claim 6 further comprising a fourth varactor diode arranged in series with the first varactor diode and in an opposite direction in a back-to-back arrangement.

14. The temperature controlled attenuator circuit of claim 6 further comprising a fifth varactor diode arranged in series with the second varactor diode and in an opposite direction in a back-to-back arrangement and/or a sixth varactor diode arranged in series with the third varactor diode and in an opposite direction in a back-to-back arrangement.

15. The temperature controlled attenuator circuit of claim 1, wherein the temperature sensor circuit includes:
a first transistor configured to be thermally isolated from the electronic component and being configured to sense an ambient temperature; and
a second transistor configured to be thermally linked to the electronic component and being configured to sense the temperature at the electronic component, the temperature sensor circuit being a differential circuit having a first path and a second path with the first and second transistors being arranged on the first and second paths of the differential circuit, respectively, such that the temperature sensor circuit generates the control voltage inversely proportional to a temperature difference between the ambient temperature and the temperature at the electronic component.

16. The temperature controlled attenuator circuit of claim 15, wherein the temperature sensor further includes a shut-off switch configured to activate or deactivate the temperature sensor circuit.

17. The temperature controlled attenuator circuit of claim 15 further comprising a first resistor and a second resistor arranged on the first and second paths of the differential circuit, respectively.

18. The temperature controlled attenuator circuit of claim 15 wherein the first transistor comprises a base, a collector, and an emitter, the collector of the first transistor being coupled to the base of the first transistor and the second transistor comprises a base, a collector, and an emitter, the collector of the first transistor being coupled to the base of the second transistor.

19. The temperature controlled attenuator circuit of claim 18 further comprising a third transistor coupled to the temperature sensor circuit and having a base, a collector, and an emitter, the base of the third transistor being coupled to the collector of the second transistor, the third transistor configured such that the current it draws decreases in response to heating at the second transistor.

20. The temperature controlled attenuator circuit of claim 19 further comprising either or both of a third resistor and a fourth resistor, the third resistor being arranged to couple the first and second paths of the differential circuit in parallel and the fourth resistor being arranged to couple the second path of the differential circuit to the collector of the third transistor such that a variation with temperature of the control voltage can be set based upon resistances of the third and/or fourth resistors.

21. The temperature controlled attenuator circuit of claim 19 configured such that an output voltage of the temperature sensor circuit is taken at the collector of the third transistor.

22. The temperature controlled attenuator circuit of claim 19 wherein the temperature sensor circuit further has a shut-off switch configured to activate or deactivate the temperature sensor circuit, and wherein the shut-off switch comprises a fourth transistor, the fourth transistor having a collector of the fourth transistor connected to the emitters of each of the first transistor, the second transistor, and the third transistor.

23. A radio frequency module comprising a temperature controlled attenuator circuit and an amplifier, the temperature controlled attenuator circuit having:
a temperature sensor circuit for sensing a temperature of the amplifier and generating a control voltage inversely proportional to a difference in temperature between an ambient temperature and the temperature of the amplifier; and a variable attenuator circuit configured to attenuate an output of the amplifier, the variable attenuator circuit further configured to vary its attenuation based upon the control voltage to provide an attenuation based upon the difference in temperature between the ambient temperature and the temperature of the amplifier.

24. A wireless device comprising a temperature controlled attenuator circuit and an amplifier, the temperature controlled attenuator circuit having:
- a temperature sensor circuit for sensing a temperature of the amplifier and generating a control voltage inversely proportional to a difference in temperature between an ambient temperature and the temperature of the amplifier; and
- a variable attenuator circuit configured to attenuate an output of the amplifier, the variable attenuator circuit further configured to vary its attenuation based upon the control voltage to provide an attenuation based upon the difference in temperature between the ambient temperature and the temperature of the amplifier.

\* \* \* \* \*